United States Patent [19]

Tanaki et al.

[11] Patent Number: 5,237,201
[45] Date of Patent: Aug. 17, 1993

[54] TAB TYPE SEMICONDUCTOR DEVICE AND METHOD OF MANUFACTURING THE SAME

[75] Inventors: Toru Tanaki, Kawasaki; Yasoji Suzuki, Yokohama, both of Japan

[73] Assignee: Kabushiki Kaisha Toshiba, Kawasaki, Japan

[21] Appl. No.: 795,257

[22] Filed: Nov. 19, 1991

Related U.S. Application Data

[63] Continuation of Ser. No. 554,527, Jul. 19, 1990, abandoned.

[30] Foreign Application Priority Data

Jul. 21, 1989 [JP] Japan .................................. 1-187394
Jul. 5, 1990 [JP] Japan .................................. 2-178081

[51] Int. Cl.⁵ .............................................. H01L 23/48
[52] U.S. Cl. ...................................... 257/666; 257/668; 257/670
[58] Field of Search ................. 357/70; 257/666, 668, 257/670

[56] References Cited

U.S. PATENT DOCUMENTS

| | | | |
|---|---|---|---|
| 4,132,856 | 1/1979 | Hutchison et al. | 357/70 |
| 4,949,155 | 8/1990 | Tajima et al. | 357/70 |
| 4,977,441 | 12/1990 | Ohtani et al. | 357/70 |
| 5,001,544 | 3/1991 | Boucard | 357/70 |
| 5,036,379 | 7/1991 | Smith et al. | 357/70 |
| 5,036,380 | 7/1991 | Chase | 357/70 |
| 5,049,974 | 9/1991 | Nelson et al. | 357/70 |

FOREIGN PATENT DOCUMENTS 57-93559 6/1982 Japan .
1-171258 7/1989 Japan .

OTHER PUBLICATIONS

"Testable TAB tape with inner guard ring", IBM TDB, vol. 31, No. 4, Sep./88, pp. 30-31.

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

This invention provides a TAB type semiconductor device in which a plurality of lead pattern regions are formed on a film-like tape formed of an insulating resin, and LSI chips are inner lead-bonded onto the corresponding lead pattern regions. A linear reference potential supply wiring pattern is formed on one edge portion in the widthwise direction of a formation surface of the lead pattern regions on the tape to extend in the tape extending direction. The wiring pattern is electrically connected to a reference potential supply lead (14A) of each lead pattern region.

7 Claims, 9 Drawing Sheets

TAB TYPE SEMICONDUCTOR DEVICE AND METHOD OF MANUFACTURING THE SAME

This application is a continuation of application Ser. No. 07/554,527, filed Jul. 19, 1990, abandoned.

BACKGROUND OF THE INVENTION

1. Field of the Invention

The present invention relates to a TAB (Tape Automated Bonding) type semiconductor device in which a semiconductor chip is mounted on an insulating film, and a method of manufacturing the same.

2. Description of the Related Art

As an LSI (Large-Scale Integrated circuit) packaging method, a so-called TAB method is known. In this method, LSI chips are inner lead-bonded on a tape formed of an insulating resin film on which a conductive pattern is formed.

Figure 1:
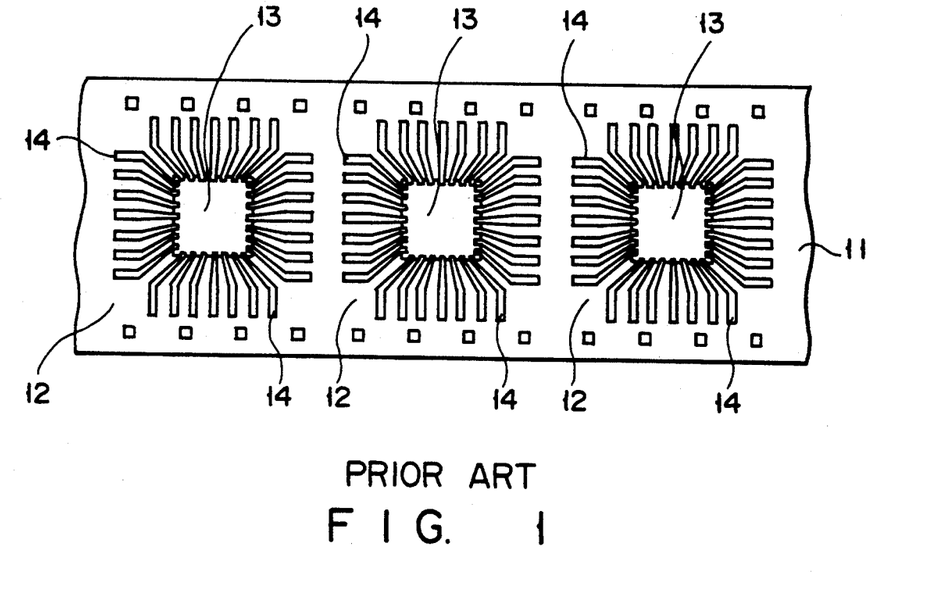
FIG. 1 is a plan view of a conventional semiconductor device.

FIG. 1 is a plan view of a conventional TAB type LSI device. In FIG. 1, reference numeral 11 denotes a film-like tape formed of an insulating resin; 12, lead pattern regions formed by patterning a metal thin film; and 13, LSI chips.

Each lead pattern region 12 is provided with a plurality of leads 14 including inner and outer leads for supplying a power supply potential and inputting/outputting signals to a corresponding LSI chip 13. Each LSI chip 13 is electrically connected to the distal end portions of the inner leads, each has one free end of a corresponding lead 14 located at the central portion of each lead pattern region 12, by, e.g., inner lead-bonded.

Figure 2:
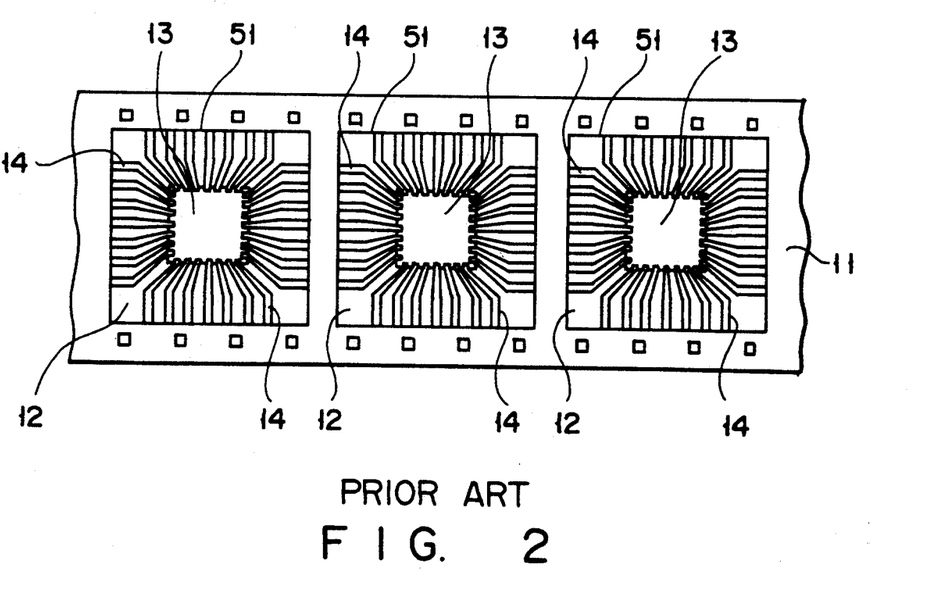
FIG. 2 is a plan view of another conventional semiconductor device.

FIG. 2 is a plan view of another conventional TAB type LSI device. In this device, the distal ends of the outer leads each as the other free end of a corresponding lead 14 located at the peripheral portion of each lead pattern region 12 are short-circuited by a short-circuiting conductive pattern 51.

In this structure, even if a high voltage caused by a surge current is applied to any lead 14, the LSI chip can be prevented from electrostatic breakdown since all the leads 14 are kept at an equal potential by the short-circuiting conductive pattern 51.

However, in the structure shown in FIG. 1, the material of the tape can be easily electrostatically charged. Thus, when a metal member of, e.g., a tape feed mechanism is brought into simutaneous contact with a tape surface and lead surfaces during a tape feed operation in, e.g., an operation test mode, a high voltage is applied to leads due to static electricity, and LSI chips are electrostatically broken.

On the other hand, in the structure shown in FIG. 2, since the leads are short-circuited by the short-circuiting conductive pattern, an energization operation cannot be performed.

SUMMARY OF THE INVENTION

It is, therefore, an object of the present invention to provide a TAB type semiconductor device which allows an energization operation, and can prevent electrostatic breakdown of semiconductor chips, and a method of manufacturing the same.

According to the present invention, there is provided a TAB type semiconductor device comprising an insulating film, a plurality of lead pattern regions formed on one surface of the film, and each consisting of a plurality of leads, and a reference potential supply wiring pattern electrically connected to a reference potential supply lead of the plurality of leads of each of the plurality of lead pattern regions, and extending along a longitudinal direction of the film.

According to the present invention, there is provided a TAB type semiconductor device comprising an insulating film, a plurality of lead pattern regions formed on one surface of the film, and each consisting of a plurality of leads, a reference potential supply wiring pattern electrically connected to a reference potential supply lead of the plurality of leads of each of the plurality of lead pattern regions, and extending along a longitudinal direction of the film, and a plurality of semiconductor chips each having a plurality of electrodes, and placed on the plurality of lead pattern regions, the plurality of electrodes being electrically connected to the plurality of leads.

Furthermore, according to the present invention, a method of manufacturing a TAB type semiconductor device comprises the steps of: adhering a conductive thin film on one surface of an insulating film; selectively removing the conductive thin film to form a plurality of lead pattern regions each consisting of a plurality of leads; forming a reference potential supply wiring pattern electrically connected to a reference potential supply lead of the plurality of leads of each of the plurality of lead pattern regions, and extending in a longitudinal direction of the tape; mounting semiconductor chips on the plurality of lead pattern regions, and electrically connecting a plurality of electrodes arranged on each of the semiconductor chips to the plurality of leads; and cutting the plurality of lead pattern regions mounting the semiconductor chips thereon together with the film while a reference potential is supplied to the reference potential supply wiring pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIGS. 16A to 16C show a structure of the eleventh embodiment of a semiconductor device according to the present invention, in which

FIGS. 17A to 17C show a structure of the twelfth embodiment of a semiconductor device according to the present invention, in which

FIGS. 18A to 18C show a structure of the thirteenth embodiment of a semiconductor device according to the present invention, in which

DETAILED DESCRIPTION OF THE PREFERRED EMBODIMENTS

Preferred embodiments of the present invention will no be described with reference to the accompanying drawings.

Figure 3:
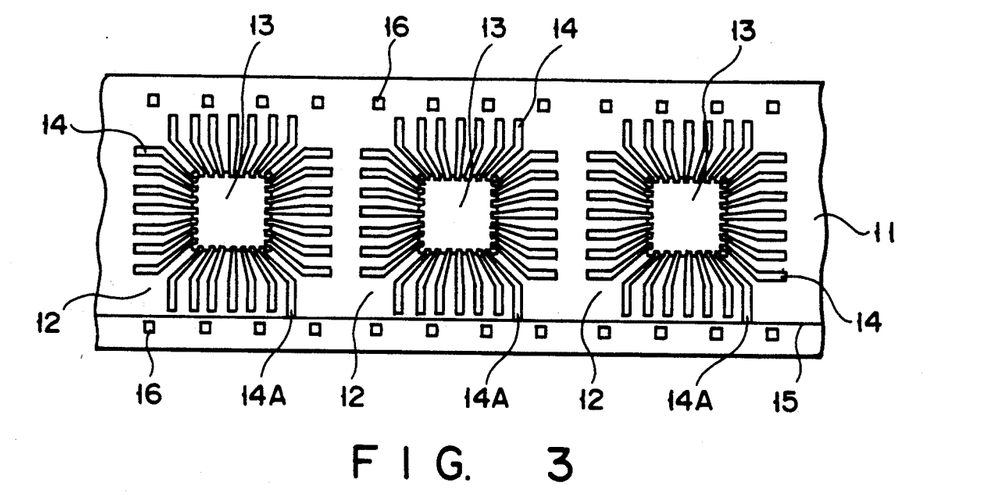
FIG. 3 is a plan view showing a structure of the first embodiment of a semiconductor device according to the present invention.

In FIG. 3, reference numeral 11 denotes a film-like tape formed of an insulating resin, e.g., a polyester-based resin; 12, lead pattern regions formed by patterning a metal thin film, e.g., a Cu thin film; and 13, LSI chips.

Each lead pattern region 12 is provided with a plurality of leads 14 including inner and outer leads for supplying a power supply potential and inputting/ outputting signals to a corresponding LSI chip 13. Each LS chip 13 is electrically connected to the distal end portions of the inner leads, each has one free end of a corresponding lead 14 located at the central portion of each lead pattern region 12, by inner-lead bonding.

A linear wiring pattern 15 for supplying a reference potential is arranged along the longitudinal direction of the tape 11 on one edge portion in the widthwise direction of a formation surface of the lead pattern regions 12 on the tape 11. The wiring pattern 15 is electrically connected to a reference potential supply lead 14A of the plurality of leads 14 of each lead pattern region 12. Perforations 16 used for feeding a tape ar formed at equal intervals in two edge portions in the widthwise direction of the tape 11.

Figure 4:
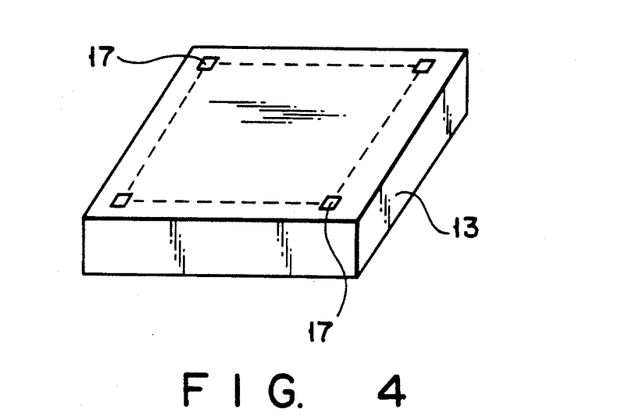
FIG. 4 is a perspective view showing an outer appearance of an LSI chip used in the semiconductor device of the first embodiment.

FIG. 4 is a perspective view showing an outer appearance of each LSI chip 13 inner lead-bonded onto a corresponding lead pattern region 12. Each LSI chip 13 is constituted by forming a desired circuit on a p- or n-type silicon semiconductor substrate by a known impurity diffusion treatment, a wiring formation technique, and the like. A plurality of electrode pads 17 for supplying a power supply potential from the outside of the chip and exchanging signals with an external circuit are formed on one surface of the substrate.

Figure 5:
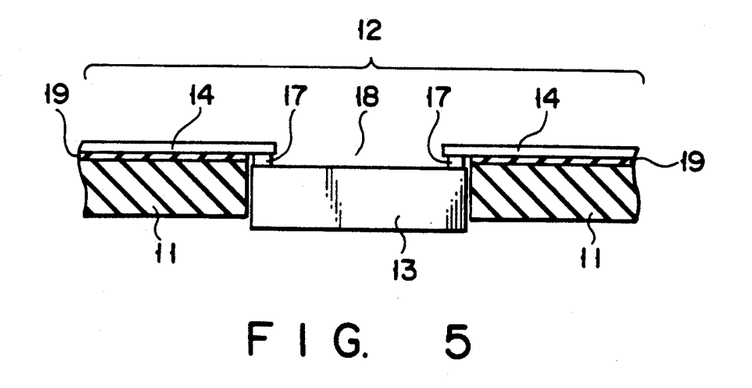
FIG. 5 is a sectional view showing a state wherein the LSI chip shown in FIG. 4 is inner lead-bonded.

FIG. 5 is a sectional view showing that the LSI chip 13 shown in FIG. 3 is inner lead-bonded onto the lead pattern region 12 of the tape 11 As shown in FIG. 5, an opening 18 in which the LSI chip 13 is inserted is formed in advance in each lead pattern region 12 of the tape 11. The LSI chip 13 is inserted in the corresponding opening 18, and the plurality of electrode pads 17 formed on the surface of the chip 13 and the plurality of leads 14 of the lead pattern region 12 are connected by, e.g., thermocompression bonding. As a result, the LSI chip 13 is inner lead-bonded to the lead pattern region 12. Each lead 14 is fixed in advance to the tape 11 by an adhesive 19.

In this structure, when an energization operation of the LSI chips 13 mounted on the tape is to be performed, the LSI chips 13 are sequentially fed to an energization position using a tape feed mechanism (not shown). In this case, a reference potential necessary for operating the LSI chip, e.g., a ground potential of 0 V or a positive or negative power supply potential is supplied to the wiring pattern 15 on the tape 11.

Since the material of the tape 11 is easily electrostatically charged, static electricity generated by friction upon tape feed is charged on the tape 11. When a metal member of the tape feed mechanism is brought into simultaneous contact with the tape surface and the lead surfaces, a high voltage caused by the static electricity is applied to the leads. However, each LSI chip 13 is applied with a reference potential via the reference potential supply wiring pattern 15 and the lead 14A. For this reason, the high voltage caused by the static electricity applied to the leads escapes to a reference potential via an internal circuit of each LSI chip 13. Therefore, the potential of the leads applied with the high potential caused by the static electricity is lowered to a predetermined low potential, and the LSI chip can be prevented from being electrostatically broken, unlike in conventional LSI chips.

Figure 6:
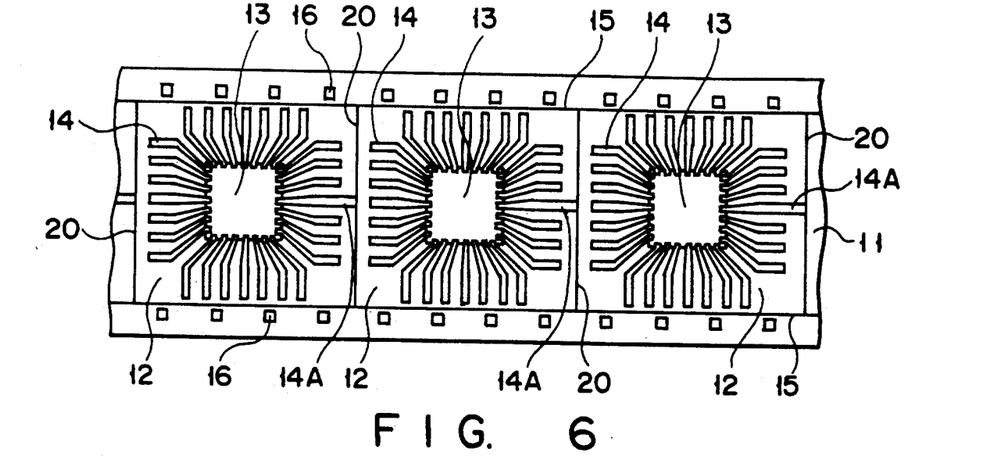
FIG. 6 is a plan view showing a structure of the second embodiment of a semiconductor device according to the present invention.

FIG. 6 is a plan view showing a structure of the second embodiment of a semiconductor device according to the present invention.

In this embodiment, reference potential supply wiring patterns 15 are arranged on the two edge portions in the widthwise direction of the tape 11 to extend in the extending direction of the tape 11, and linear wiring patterns 20 for short-circuiting the two wiring patterns 15 are formed along the widthwise direction of the tape 11 to surround the lead pattern regions 12.

In this case, the reference potential supply lead 14A of the plurality of leads 14 of each lead pattern region 12 is located at substantially the central portion of the tape 11, and is electrically connected to the corresponding wiring pattern 20.

Figure 7:
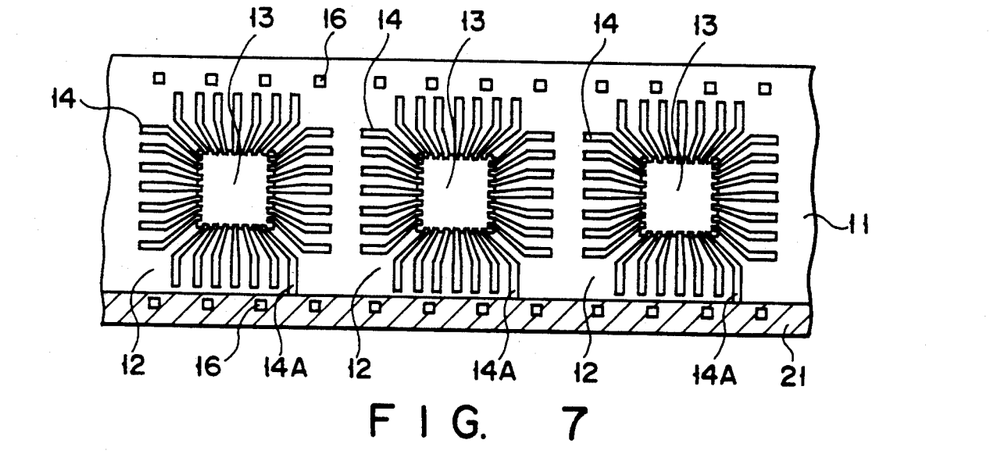
FIG. 7 is a plan view showing a structure of the third embodiment of a semiconductor device according to the present invention.

FIG. 7 is a plan view showing a structure of the third embodiment of a semiconductor device according to the present invention.

In this embodiment, in place of the linear reference potential supply wiring pattern 15 in the first embodiment shown in FIG. 3, a sufficiently wide strip-like reference potential supply wiring pattern 21 is arranged, as indicated by hatching in FIG. 7.

Figure 8:
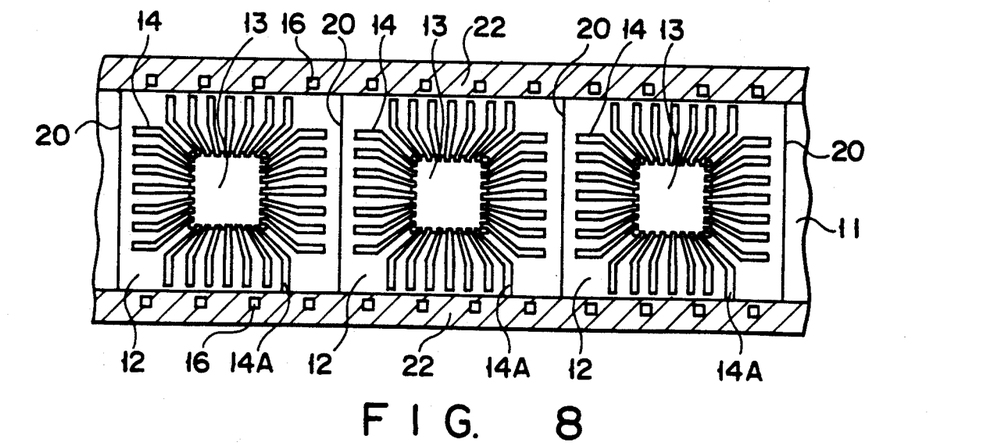
FIG. 8 is a plan view showing a structure of the fourth embodiment of a semiconductor device according to the present invention.

FIG. 8 is a plan view showing a structure of the fourth embodiment of a semiconductor device according to the present invention.

In this embodiment, in place of the linear reference potential supply wiring patterns 15 in the second embodiment shown in FIG. 6, sufficiently wide strip-like reference potential supply wiring patterns 22 are arranged, as indicated by hatching in FIG. 8. In this case, the reference potential supply lead 14A of each lead pattern region 12 is located at the edge portion of the tape 11 like in the embodiments shown in FIGS. 3 and 7.

Figure 9:
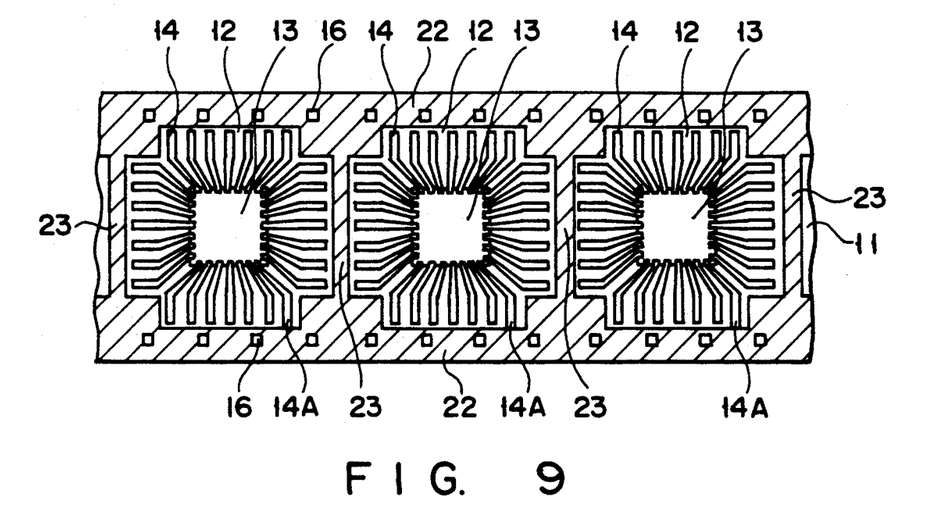
FIG. 9 is a plan view showing a structure of the fifth embodiment of a semiconductor device according to the present invention.

FIG. 9 is a plan view showing a structure of the fifth embodiment of a semiconductor device according to the present invention.

In this embodiment, in place of the linear wiring pattern 20 in the fourth embodiment shown in FIG. 8, a sufficiently wide strip-like wiring pattern 23 is arranged, as indicated by hatching in FIG. 9. Thus, the reference potential supply pattern is formed on most of the tape excluding the lead pattern regions 12.

Figure 10:
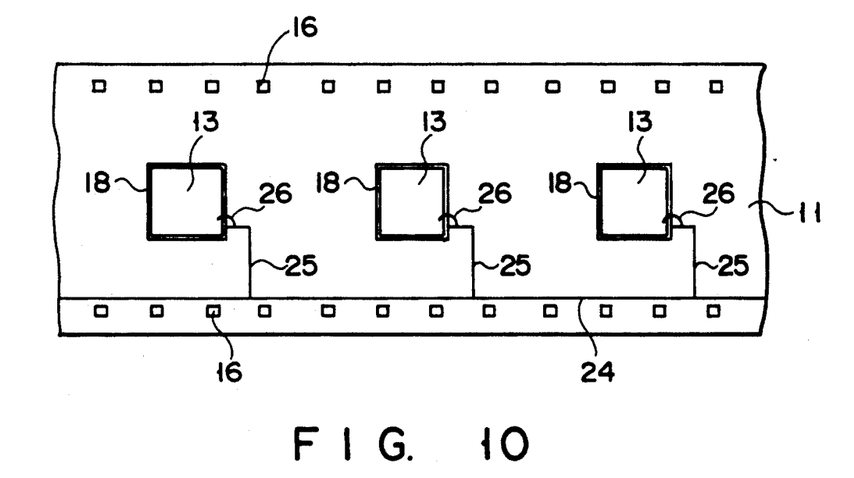
FIG. 10 is a plan view showing a structure of the sixth embodiment of a semiconductor device according to the present invention.

FIG. 10 is a plan view showing a structure of the sixth embodiment of a semiconductor device according to the present invention.

In this embodiment, a linear reference potential supply wiring pattern 24 is formed on one edge portion in the widthwise direction of the tape 11 on a surface opposite to the formation surface of the lead patter regions 12 of the tape 11, i.e., on the lower surface of the tape 11. In addition, a plurality of linear wiring patterns 25 are formed on the lower surface. One end portion of each wiring pattern 25 is connected to the reference potential supply wiring pattern 24, and the other end portion extends to a position near each opening 18. Each wiring pattern 25 is electrically connected to the lower surface of each LSI chip 13 by a bonding wire 26 at a position near the opening 18.

Figure 11:
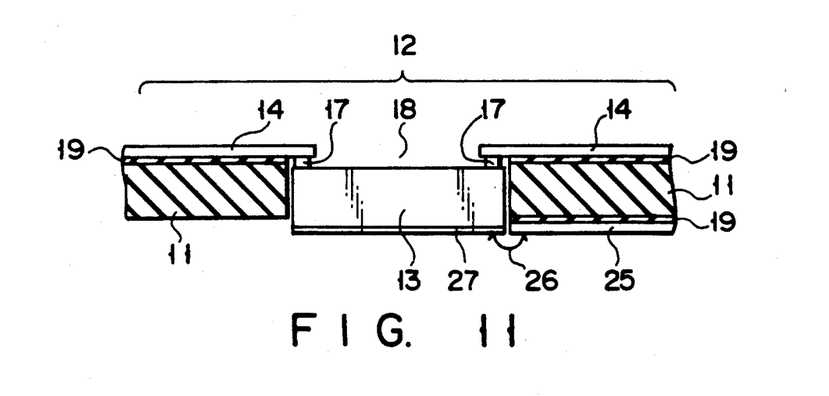
FIG. 11 is a partial sectional view showing a structure near a lead pattern region in the embodiment shown in FIG. 10.

FIG. 11 is a partial sectional view of a structure near the lead pattern region 12 in the embodiment shown in FIG. 10. In this embodiment, the bonding wire 26 must be connected on the lower surface of the LSI chip 13. For this purpose, a metal layer 27 is preformed on the lower surface of the chip.

In general, a substrate of an LSI chip is set at a ground potential or a power supply potential. Therefore, with this structure, if a reference potential necessary for operating the LSI chip is supplied to the reference potential supply wiring pattern 24, the LSI chip can be prevented from being electrostatically broken for the same reason as described above.

Figure 12:
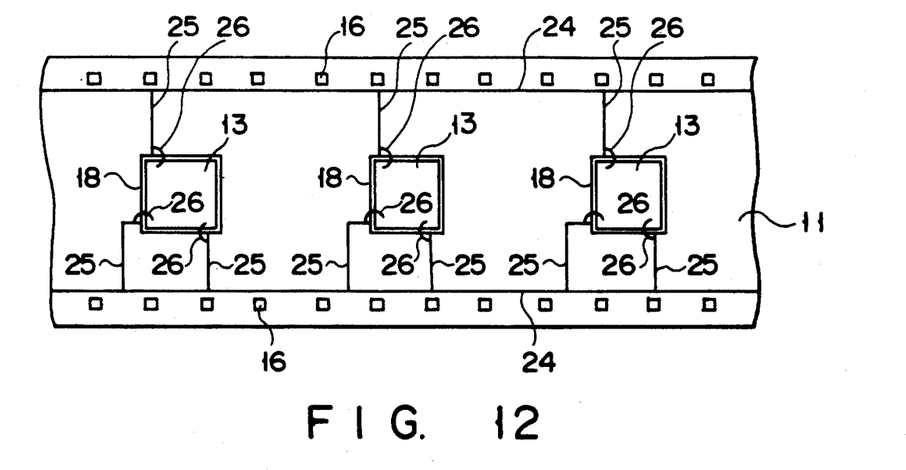
FIG. 12 is a plan view showing a structure of the seventh embodiment of a semiconductor device according to the present invention.

FIG. 12 is a plan view showing a structure of the seventh embodiment of a semiconductor device according to the present invention.

In this embodiment, reference potential supply wiring patterns 24 are arranged on the two edge portions in the widthwise direction of the tape on the lower surface of the tape to extend along the extending direction of the tape, and a plurality of linear wiring patterns 25 are arranged for each opening 18. In addition, the wiring patterns 25 and the lower surface of each LSI chip 13 are electrically connected via the bonding wires 26.

Figure 13:
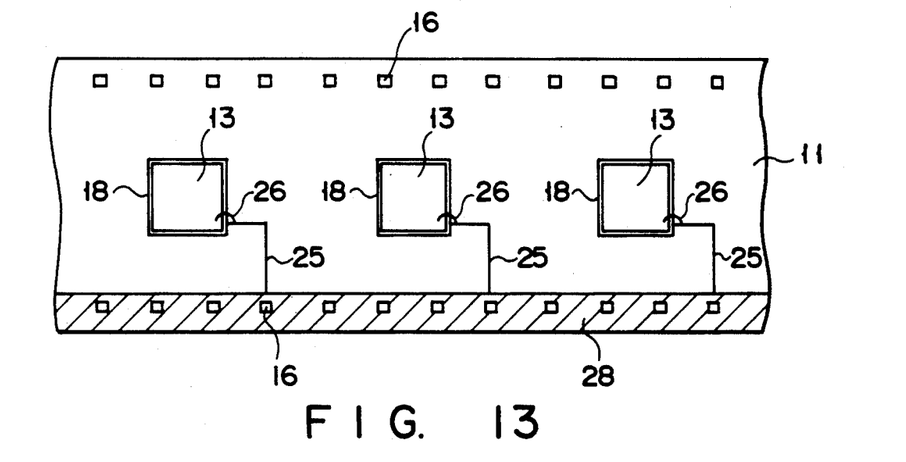
FIG. 13 is a plan view showing a structure of the eighth embodiment of a semiconductor device according to the present invention.

FIG. 13 is a plan view showing a structure of the eighth embodiment of a semiconductor device according to the present invention.

In this embodiment, in place of the linear reference potential supply wiring pattern 24 in the sixth embodiment shown in FIG. 6, a sufficiently wide strip-like reference potential supply wiring pattern 28 is arranged, as indicated by hatching in FIG. 13.

Figure 14:
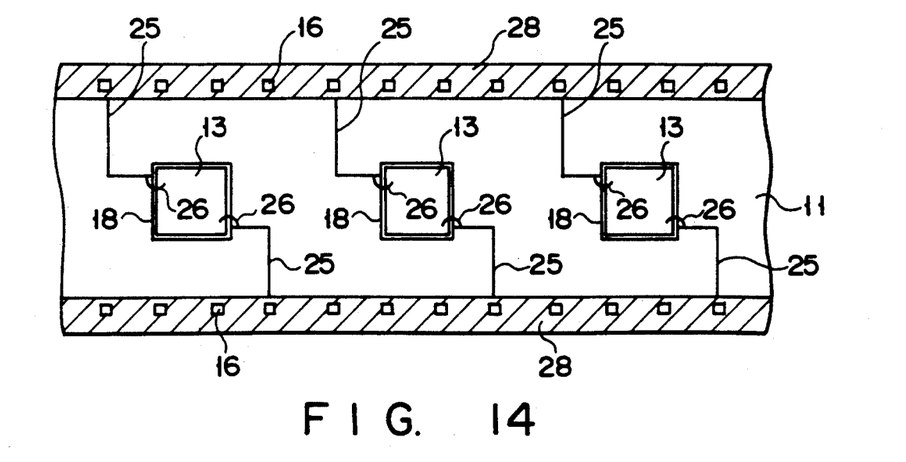
FIG. 14 is a plan view showing a structure of the ninth embodiment of a semiconductor device according to the present invention.

FIG. 14 is a plan view showing a structure of the ninth embodiment of a semiconductor device according to the present invention.

In this embodiment, strip-like reference potential supply wiring patterns 28 in the embodiment shown in FIG. 13 are arranged on the two edge portions in the widthwise direction of the tape on the lower surface of the tape.

Figure 15:
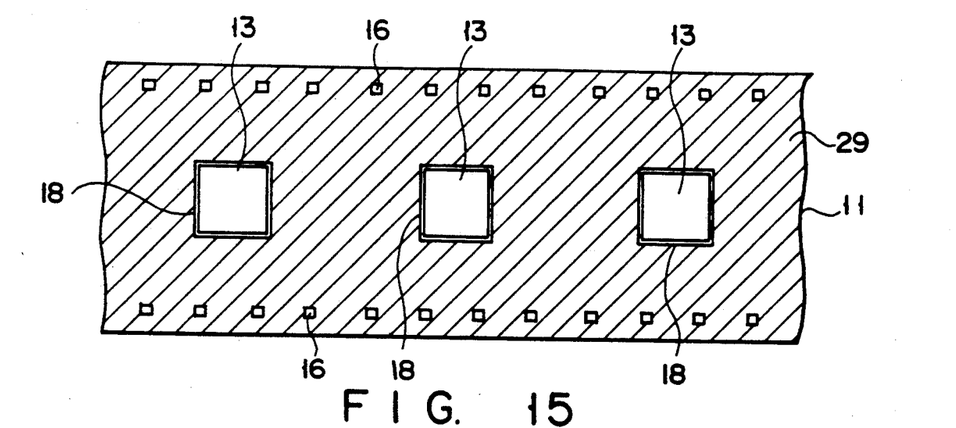
FIG. 15 is a plan view showing a structure of the tenth embodiment of a semiconductor device according to the present invention.

FIG. 15 is a plan view showing a structure of the tenth embodiment of a semiconductor device according to the present invention.

In this embodiment, a reference potential supply pattern 29 is arranged on the entire lower surface of the tape except for the openings 18.

Figure 16A:
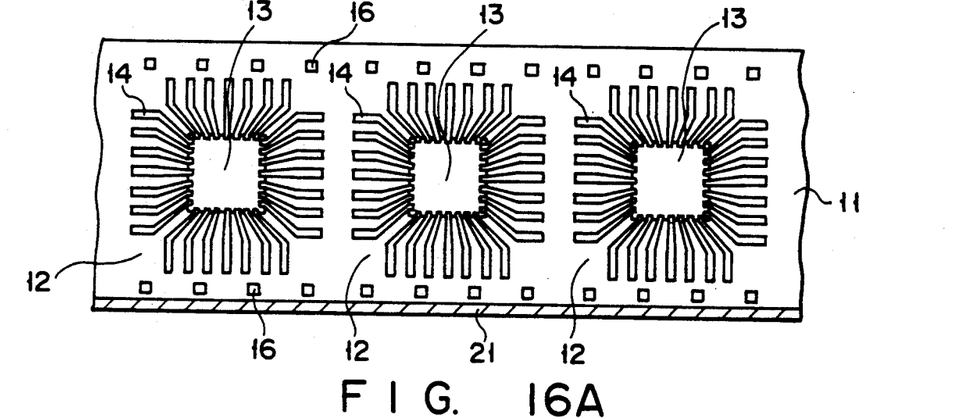
FIG. 16A is a plan view.
Figure 16B:
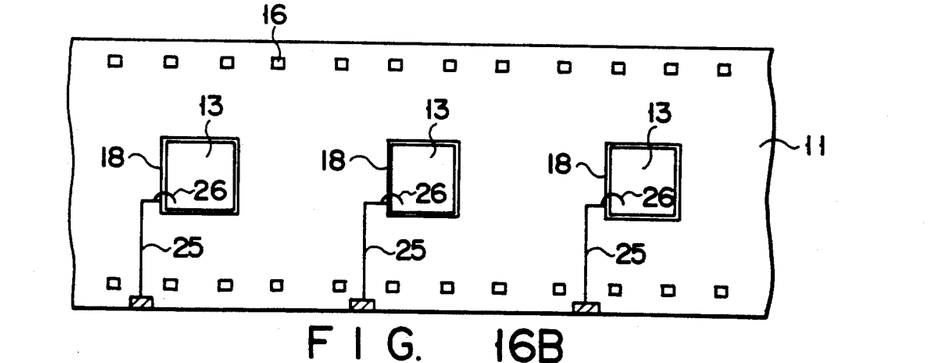
FIG. 16B is a bottom view.
Figure 16C:
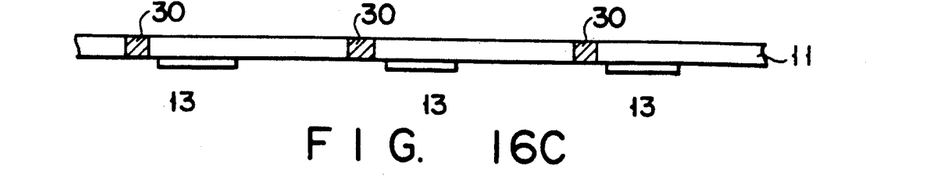
FIG. 16C is a side view.

FIGS. 16A to 16C show a structure of the eleventh embodiment of a semiconductor device according to the present invention, in which FIG. 16A is a plan view, FIG. 16B is a bottom view, and FIG. 16C is a side view.

In this embodiment, as indicated by hatching in FIG. 16A, the same strip-like reference potential supply wiring pattern 21 as in the embodiment shown in FIG. 7 is arranged on the upper surface of the tape 11. As shown in FIG. 16B, a plurality of linear wiring patterns 25 are arranged on the lower surface of the tape 11. One end portion of each wiring pattern 25 is electrically connected to the lower surface of each LSI chip 13 inserted in the corresponding opening 18 of the tape 11 through the bonding wire 26. The other end portion of each wiring pattern 25 is connected to each of a plurality of wiring patterns 30 selectively formed in the side surface of the tape 11.

Therefore, in this embodiment, the lower surface of each LSI chip 13 is electrically connected to the reference potential supply wiring pattern 21 formed on the upper surface of the tape 11 via the bonding wire 26 and the wiring patterns 25 and 30.

Figure 17A:
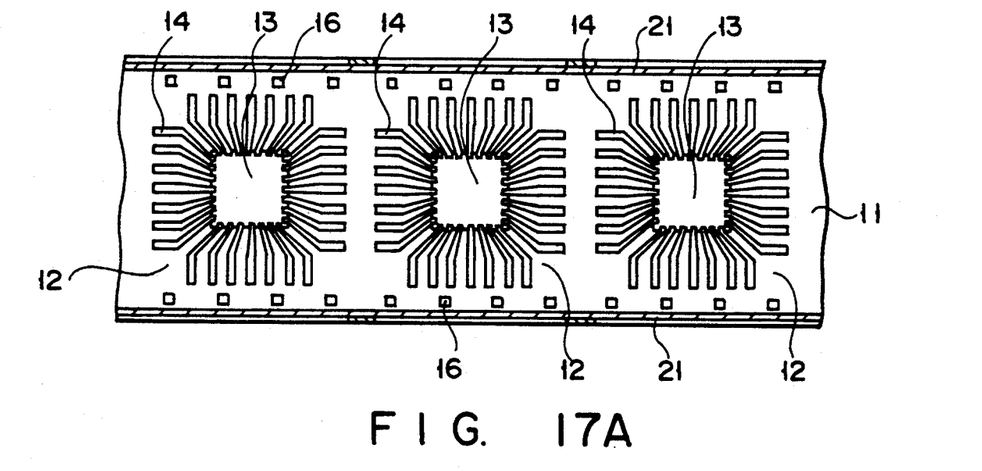
FIG. 17A is a plan view.
Figure 17B:
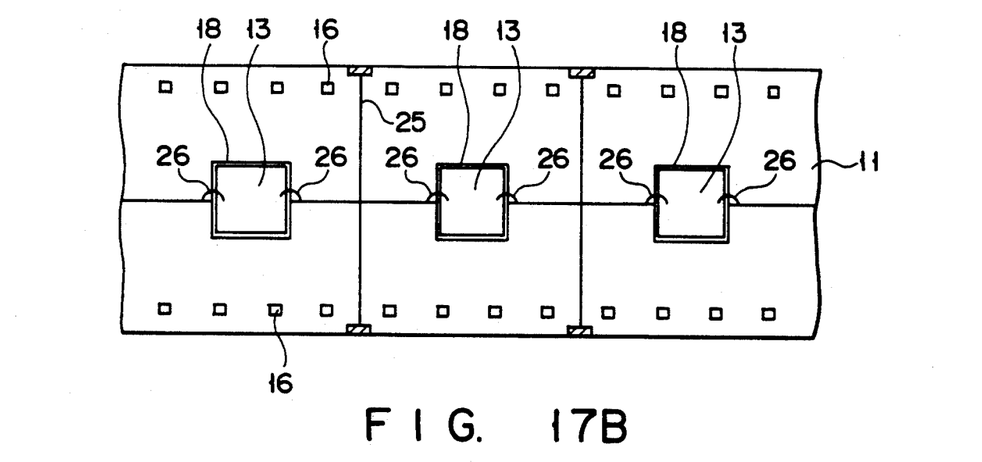
FIG. 17B is a bottom view.
Figure 17C:
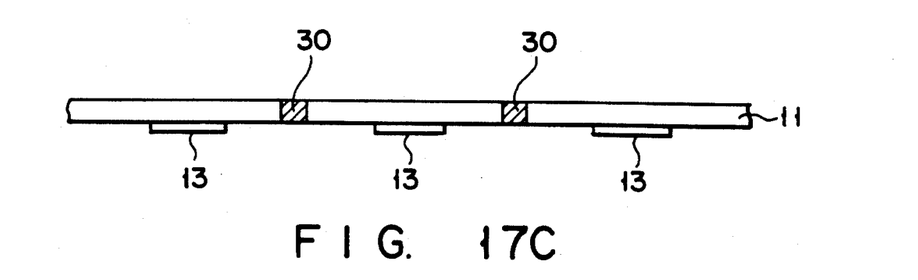
FIG. 17C is a side view.

FIGS. 17A to 17C show a structure of the eleventh embodiment of a semiconductor device according to the present invention, in which FIG. 17A is a plan view, FIG. 17B is a bottom view, and FIG. 17C is a side view.

In this embodiment, as indicated by hatching in FIG. 17A, the same strip-like reference potential supply wiring pattern 21 as in the embodiment shown in FIG. 8 is formed on the upper surface side of the tape 11. As in the embodiment shown in FIGS. 16A to 16C, a plurality of linear wiring patterns 25 are formed on the lower surface side of the tape 11. One end portion of each wiring pattern 25 is electrically connected to the rear surface of each LSI chip 13 inserted in the corresponding opening 18 of the tape 11 via the bonding wire 26, and the other end portion of each wiring pattern 25 is connected to each of a plurality of wiring patterns 30 selectively formed in the side surface of the tape 11. In this embodiment, the rear surface of each LSI chip 13 is electrically connected to the reference potential supply wiring pattern 22 formed on the upper surface of the tape 11 via the bonding wire 26 and the wiring patterns 25 and 30.

Figure 18A:
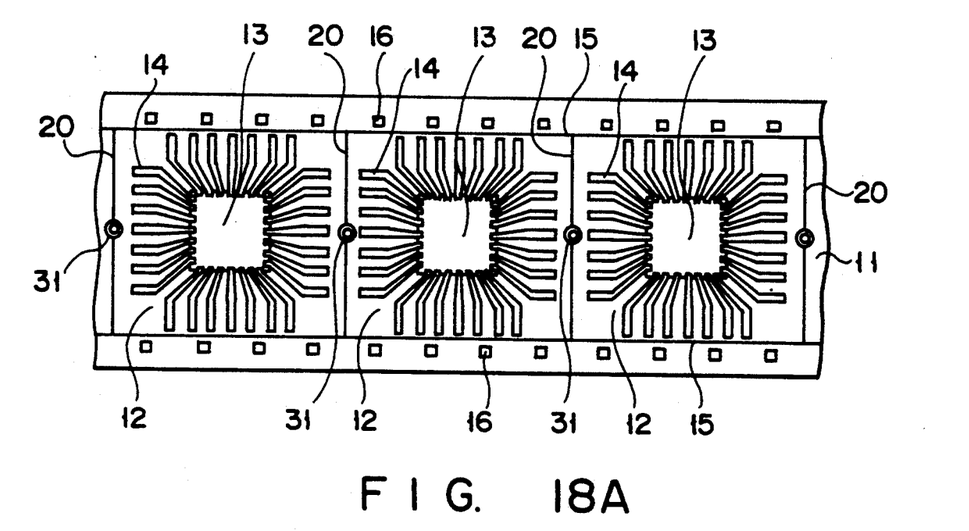
FIG. 18A is a plan view.
Figure 18B:
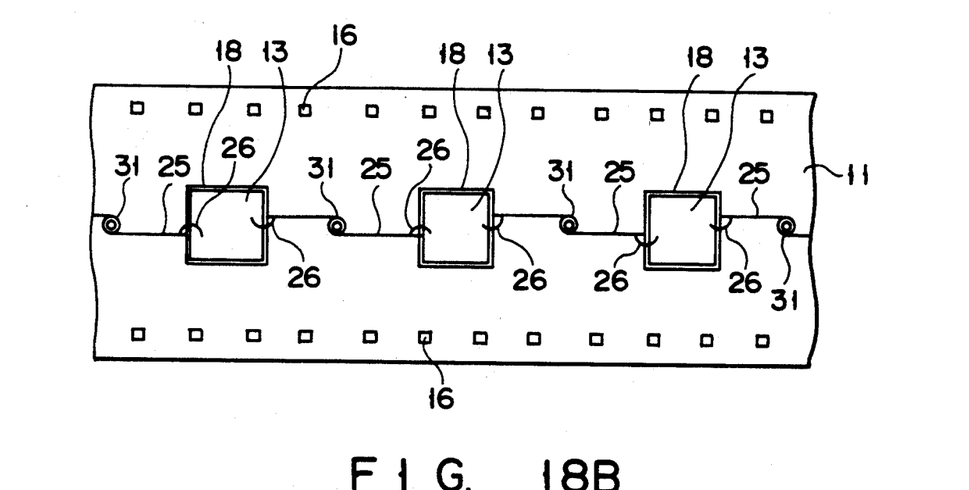
FIG. 18B is a bottom view.
Figure 18C:
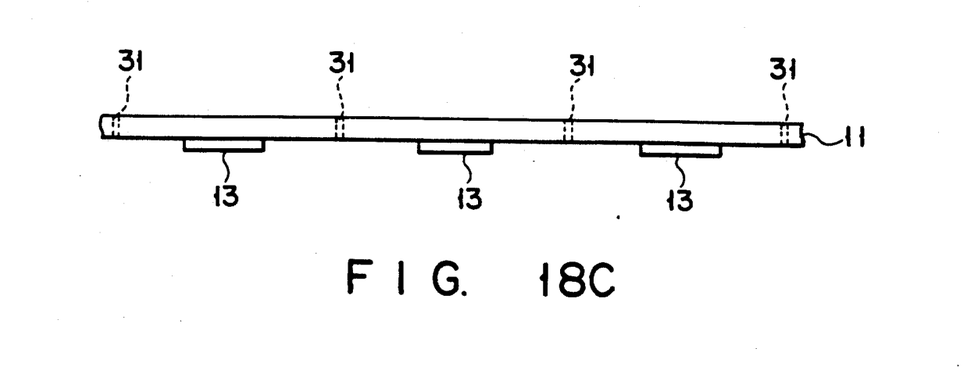
FIG. 18C is a side view.

FIGS. 18A to 18C show a structure of the eleventh embodiment of a semiconductor device according to the present invention, in which FIG. 18A is a plan view, FIG. 18B is a bottom view, and FIG. 18C is a side view.

In this embodiment, as shown in FIG. 18A, the reference potential supply wiring patterns 15 are arranged on the surface of the tape 11 to extend in the tape extending direction like in the embodiment shown in FIG.

6, and the linear wiring patterns 20 for short-circuiting the wiring patterns 15 are formed. As shown in FIG. 18B, a plurality of linear wiring patterns 25 are formed on the lower surface of the tape 11. One end portion of each wiring pattern 25 is electrically connected to the lower surface of each LSI chip 13 inserted in the corresponding opening 18 of the tape 11 via the bonding wire 26. In this embodiment, a through hole 31 extending through the upper and lower surfaces of the tape is formed in a middle portion of each wiring pattern 25, and the inner wall of each through hole 31 is metal-plated. Therefore, in this embodiment, the lower surface of each LSI chip 13 is electrically connected to the reference potential supply wiring patterns 15 formed on the upper surface of the tape 11 via the bonding wires 26, the wiring patterns 25, the through holes 31, and the wiring patterns 20.

A method of manufacturing a semiconductor device with the above-mentioned structure will be described below.

Figure 19:
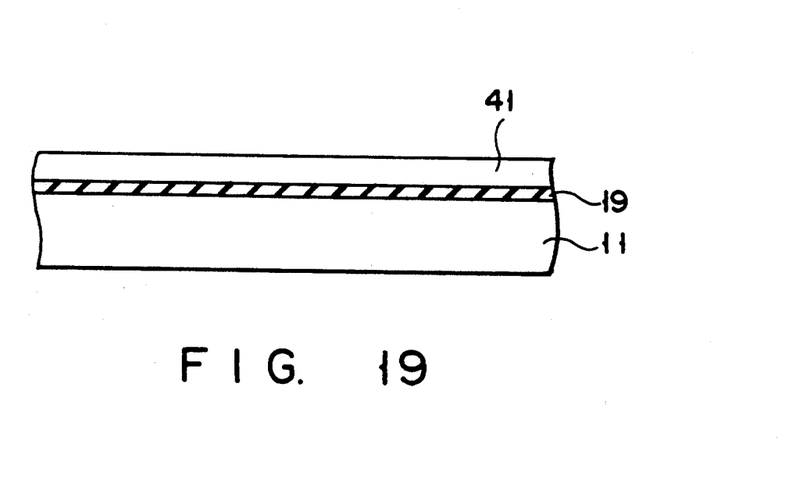
FIG. 19 is a sectional view for explaining a method of manufacturing a semiconductor device according to the present invention.

As shown in the sectional view of FIG. 19, a metal thin film, e.g., a Cu thin film 41 is adhered through the adhesive 19 onto the surface of the tape 11 on which the perforations 16 and the LSI chip insertion openings 18 (neither are shown in FIG. 19) are formed as shown in FIGS. 3 to 5. When a conductive pattern is to be formed on the lower surface of the tape 11 like in the embodiment shown in FIG. 10, the Cu thin films 41 are adhered on both the surfaces of the tape 11.

The Cu thin film 41 is patterned by photoetching, thus simultaneously forming the plurality of lead pattern regions 12 each consisting of the plurality of leads 14 and the reference potential supply wiring pattern 15, as shown in, e.g., FIG. 3.

Each LSI chip 13 is inserted in the corresponding opening 18 formed in the tape 11 and the plurality of pad electrodes 17 preformed on the surface of the chip 13 and the plurality of leads 14 of the lead pattern region 12 are connected by, e.g., thermocompression bonding, thus achieving inner-lead bonding, as shown in the sectional view of FIG. 5.

Subsequently, the upper and lower surfaces or only the upper surface of each LSI chip 13 is covered with a potting resin, as needed. Thereafter, an energization operation for testing each LSI device is performed, and defective products are marked. In this case, the reference potential supply wiring pattern 15 is applied with a reference potential necessary for operating the LSI chips 13, e.g., a ground potential of 0 V or a positive or negative power supply voltage. For this reason, even if static electricity is generated by friction upon tape feed and a metal member of a tape feed mechanism is brought into simultaneous contact with the tape surface and the lead surfaces, the LSI chips 13 can be prevented from being electrostatically broken. Thereafter, the tape 11 is taken up, and is delivered.

When an LSI device is mounted, the tape 11 is sequentially fed from a taken-up state by a tape feed mechanism, and each lead pattern region 12 is cut by a cutter at an outer-lead bonding position, thus performing outer-lead bonding.

Figure 20:
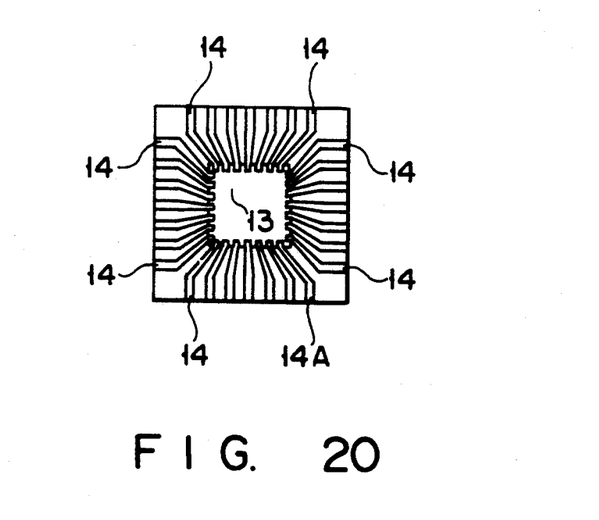
FIG. 20 is a plan view for explaining the method.

FIG. 20 shows a state wherein an LSI device is cut together with the tape 11 by, e.g., a cutter, and is separated into an individual device. The reference potential supply lead 14A of the lead pattern region 12 has substantially the same shape as those of other leads, and no problem caused by connection with the reference potential supply wiring pattern 15 is posed.

The present invention is not limited to the above embodiments, and various modifications may be made. For example, in the above embodiment, a Cu thin film is used as a metal thin film. However, other metal thin films may be used.

As described above, according to the present invention, since leads connected to a semiconductor chip on a tape can be arranged without being short-circuited to each other, electrostatic breakdown can be prevented without influencing an energization operation.

What is claimed is:

1. A semiconductor device comprising:
   an insulation film having a plurality of openings in which semiconductor chips are to be arranged;
   a plurality of lead pattern regions on a first surface of the insulation film, each lead pattern region comprising a plurality of leads including at least one reference potential supply lead; and
   a wiring pattern on substantially all of the first surface of the film not covered by the plurality of lead pattern regions, the wiring pattern being electrically connected to each of the reference potential supply leads.

2. A semiconductor device according to claim 1, wherein the wiring pattern extends along a longitudinal direction of the film and to edge portions of the film in a direction orthogonal to the longitudinal direction.

3. A semiconductor device comprising:
   an insulation film having a first surface and a second surface opposite the first surface, and having a plurality of openings in which semiconductor chips are to be arranged;
   a plurality of lead pattern regions on the first surface of the film, each lead pattern region consisting of a plurality of leads, and each lead pattern region having one of the openings in a central position;
   a plurality of semiconductor chips, at least one chip being in each of the openings;
   a reference potential supply wiring pattern, the reference potential supply wiring pattern extending along a longitudinal direction of the film on the second surface of the film; and
   wiring means for electrically connecting each of the plurality of semiconductor chips to the reference potential supply wiring pattern.

4. A semiconductor device according to claim 3, wherein each of the chips have a conductive film formed on one of the first and second surfaces for connecting to the wiring means.

5. A semiconductor device according to claim 3, wherein the reference potential supply wiring pattern extends to edge portions of the film in a direction orthogonal to the longitudinal direction.

6. A semiconductor device comprising:
   an insulation film having a first surface and a second surface opposite the first surface, and having a plurality of openings in which semiconductor chips are to be arranged;
   a plurality of lead pattern regions on the first surface of the film, each lead pattern region consisting a plurality of leads, and each lead pattern region having one of the openings in a central portion;
   a plurality of semiconductor chips, at least one chip being in each of the openings;
   a reference potential supply first wiring pattern, extending along a longitudinal direction of the film on the first surface of the film;

a plurality of second wiring patterns near each of the plurality of semiconductor chips and extending to one edge portion of the film in a direction orthogonal to the longitudinal direction, the second wiring patterns being on the second surface of the film;

connecting means for electrically connecting one of the semiconductor chips to one of the second wiring patterns; and a plurality of third wiring patterns extending through the film and electrically connecting each of the second wiring patterns to the first wiring pattern.

7. A semiconductor device comprising:

an insulation film having a first surface and a second surface opposite the first surface, and having a plurality of openings in which semiconductor chips are to be arranged;

a plurality of lead pattern regions on the first surface of the film, each lead pattern region comprising a plurality of leads, and each lead pattern region having an opening in a central portion extending through the insulation film;

a plurality of semiconductor chips, at least one chip being in each of the openings;

a reference potential supply first wiring pattern extending along a longitudinal direction of the film on the first surface of the film;

a plurality of second wiring patterns on the second surface of the film, each of the second wiring patterns extending between two openings;

connecting means for electrically connecting one of the plurality of semiconductor chips to one of the plurality of second wiring patterns; and a through hole wiring extending through the first and second surfaces of the film, for electrically connecting the first wiring patterns to the second wiring patterns.

* * * * *

UNITED STATES PATENT AND TRADEMARK OFFICE
CERTIFICATE OF CORRECTION

PATENT NO. : 5,237,201
DATED : August 17, 1993
INVENTOR(S) : Toru Tanaki et al.

It is certified that error appears in the above-indentified patent and that said Letters Patent is hereby corrected as shown below:

Claim 6, column 8, line 61, change "consisting" to --comprising--.

Signed and Sealed this

Eighth Day of November, 1994

Attest:

BRUCE LEHMAN

Attesting Officer

Commissioner of Patents and Trademarks